US011335727B2

(12) United States Patent
Yoon et al.

(10) Patent No.: US 11,335,727 B2
(45) Date of Patent: May 17, 2022

(54) IMAGE SENSING DEVICE

(71) Applicant: SK hynix Inc., Icheon-si (KR)

(72) Inventors: Hyung June Yoon, Icheon-si (KR); Jae Hyung Jang, Icheon-si (KR); Hoon Moo Choi, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 24 days.

(21) Appl. No.: 17/080,616

(22) Filed: Oct. 26, 2020

(65) Prior Publication Data
US 2021/0305310 A1    Sep. 30, 2021

(30) Foreign Application Priority Data

Mar. 27, 2020  (KR) .......................... 10-2020-0037366

(51) Int. Cl.
*H01L 27/148* (2006.01)
*H01L 27/146* (2006.01)

(52) U.S. Cl.
CPC .. *H01L 27/14812* (2013.01); *H01L 27/14603* (2013.01); *H01L 27/14614* (2013.01); *H01L 27/14638* (2013.01)

(58) Field of Classification Search
CPC ......... H01L 27/14603; H01L 27/14614; H01L 27/14638; H01L 27/14812
See application file for complete search history.

(56) References Cited

U.S. PATENT DOCUMENTS

| 9,661,194 | B2 * | 5/2017 | Sakano | ............... H04N 5/2176 |
| 10,325,953 | B2 | 6/2019 | Kawahito | |
| 2019/0148448 | A1 * | 5/2019 | Lee | ..................... H01L 27/1463 257/431 |
| 2020/0203416 | A1 * | 6/2020 | Jin | .................... H01L 27/14607 |
| 2021/0028209 | A1 * | 1/2021 | Choi | ................. H04N 5/36965 |
| 2021/0202547 | A1 * | 7/2021 | Cho | .................... H01L 27/1463 |
| 2021/0250529 | A1 * | 8/2021 | Baek | ................. H04N 5/35554 |

FOREIGN PATENT DOCUMENTS

| JP | 2007325139 A | * | 12/2007 | ....... H04N 5/232122 |
| WO | WO-2007026779 A1 | * | 3/2007 | ....... H01L 27/14609 |
| WO | WO-2019112047 A1 | * | 6/2019 | .......... G01S 7/4816 |

* cited by examiner

*Primary Examiner* — Matthew E Warren
(74) *Attorney, Agent, or Firm* — Perkins Coie LLP

(57) ABSTRACT

The image sensing device includes a pixel array including a plurality of unit pixels is arranged in rows and columns. Each of the plurality of unit pixels includes a photoelectric conversion element to generate charge carriers by converting light incident upon the photoelectric conversion element, a plurality of floating diffusion regions spaced apart from the photoelectric conversion element to hold the charge carriers, a plurality of circulation gates located at sides of the photoelectric conversion element in each of a first direction and a second direction perpendicular to the first direction, configured to create an electric field in different regions of the photoelectric conversion element based on circulation control signals, and configured to induce movement of the charge carriers, and a plurality of transfer gates located between the circulation gates, and configured to transfer the charge carriers generated by the photoelectric conversion element to a corresponding floating diffusion region.

20 Claims, 11 Drawing Sheets

IMAGE SENSING DEVICE

CROSS-REFERENCE TO RELATED APPLICATION

This patent document claims the priority and benefits of Korean patent application No. 10-2020-0037366, filed on Mar. 27, 2020, which is incorporated by reference in its entirety as part of the disclosure of this patent document.

TECHNICAL FIELD

The technology and implementations disclosed in this patent document generally relate to an image sensing device.

BACKGROUND

An image sensor is a device for converting an optical image into electrical signals. With the recent development of automotive, medical, computer and communication industries, the demand for high-performance image sensors is increasing in various devices such as digital cameras, camcorders, personal communication systems (PCSs), game consoles, surveillance cameras, medical micro-cameras, robots, etc.

SUMMARY

Various embodiments of the disclosed technology relate to an image sensing device having a new structure to improve operational characteristics thereof.

In an embodiment of the disclosed technology, an image sensing device may include a pixel array including a plurality of unit pixels arranged in rows and columns. Each of the plurality of unit pixels may include a photoelectric conversion element to generate charges carriers by converting light incident upon the photoelectric conversion element, a plurality of floating diffusion regions spaced apart from the photoelectric conversion element to hold the charge carriers, a plurality of circulation gates located at sides of the photoelectric conversion element in each of a first direction and a second direction perpendicular to the first direction, configured to create an electric field in different regions of the photoelectric conversion element based on circulation control signals, and configured to induce movement of the charge carriers, and a plurality of transfer gates located between the circulation gates, and configured to transfer the charge carriers generated by the photoelectric conversion element to a corresponding floating diffusion region.

In another embodiment of the disclosed technology, an image sensing device may include a pixel array including a plurality of unit pixels for performing photoelectric conversion of incident light and outputting an electric signal corresponding to the incident light. Each of the plurality of unit pixels may include a photoelectric conversion element to generate charge carriers by converting the incident light, a plurality of circulation gates located at sides of the photoelectric conversion element in each of a first direction and a second direction perpendicular to the first direction, a plurality of transfer gates located between the circulation gates while being arranged alternately with the circulation gates, and a plurality of floating diffusion regions located at one side of each of the plurality of transfer gates in a direction opposite to the photoelectric conversion element based on each of the plurality of transfer gates.

In another embodiment of the disclosed technology, an image sensing device may include a pixel array in which a plurality of unit pixels is arranged in an array shape. Each of the plurality of unit pixels may include a semiconductor substrate including a first surface and a second surface facing the first surface, and configured to include a photoelectric conversion element that generates photocharges by performing photoelectric conversion of light incident upon the first surface, a plurality of floating diffusion (FD) regions spaced apart from the photoelectric conversion element by a predetermined distance in the semiconductor substrate, and configured to temporarily store the photocharges, a plurality of circulation gates located at both sides of the photoelectric conversion element in each of a first direction and a second direction perpendicular to the first direction at an upper portion of the second surface, configured to partially generate an electric field in different regions of the photoelectric conversion element based on circulation control signals, and configured to induce movement of the photocharges, and a plurality of transfer gates located between the circulation gates at an upper portion of the second surface, and configured to transmit the photocharges generated by the photoelectric conversion element to a corresponding floating diffusion (FD) region from among the plurality of floating diffusion (FD) regions based on a transfer control signal.

In another embodiment of the disclosed technology, an image sensing device may include a pixel array in which a plurality of unit pixels for performing photoelectric conversion of incident light and outputting an electric signal corresponding to the incident light is arranged in an array shape. Each of the plurality of unit pixels may include a semiconductor substrate including a first surface upon which the incident light is incident and a second surface facing the first surface, and configured to include a photoelectric conversion element that generates photocharges by performing photoelectric conversion of the incident light, a plurality of circulation gates located at both sides of the photoelectric conversion element in each of a first direction and a second direction perpendicular to the first direction at an upper portion of the second surface, a plurality of transfer gates located between the circulation gates while being arranged alternately with the circulation gates at an upper portion of the second surface, and a plurality of floating diffusion (FD) regions located at one sides of the plurality of transfer gates in a direction opposite to the photoelectric conversion element based on each of the plurality of transfer gates.

It is to be understood that both the foregoing general description and the following detailed description of the disclosed technology are illustrative and explanatory and are intended to provide further explanation of the disclosure as claimed.

DETAILED DESCRIPTION

In order to acquire a three-dimensional (3D) image using the image sensor, color information of the 3D image and the distance (or depth) between a target object and the image sensor are needed.

In acquiring information associated with the distance between the target object and the image sensor, the image sensor can use a passive method or an active method.

The passive method may calculate the distance between the target object and the image sensor using only image information of the target object without providing a light signal to the target object. The passive method can be applied to a stereo camera.

Unlike the passive method, the active method can measure the distance between the target object and the image sensor using an artificial light signal provided by a laser or an LED. Examples of such an active method may include a triangulation method and a time-of-flight (TOF) method. After a light signal has been sent to the target from a light source (e.g., a laser source or an LED) spaced apart from the image sensor by a predetermined distance, the triangulation method may detect light reflected from the target object and calculate the distance between the target object and the image sensor using the detected light. After a light signal has been sent from the light source to the target object, the TOF method may measure the round trip time of the light signal, which is reflected from the target object and returns to the image sensor, to calculate the distance between the target object and the image sensor.

This patent document provides implementations and examples of an image sensing device that includes a new structure to improve operational characteristics.

Reference will now be made in detail to certain embodiments, examples of which are illustrated in the accompanying drawings. Wherever possible, the same reference numbers will be used throughout the drawings to refer to the same or similar parts. In the following description, a detailed description of related known configurations or functions incorporated herein will be omitted to avoid obscuring the subject matter.

Figure 1:
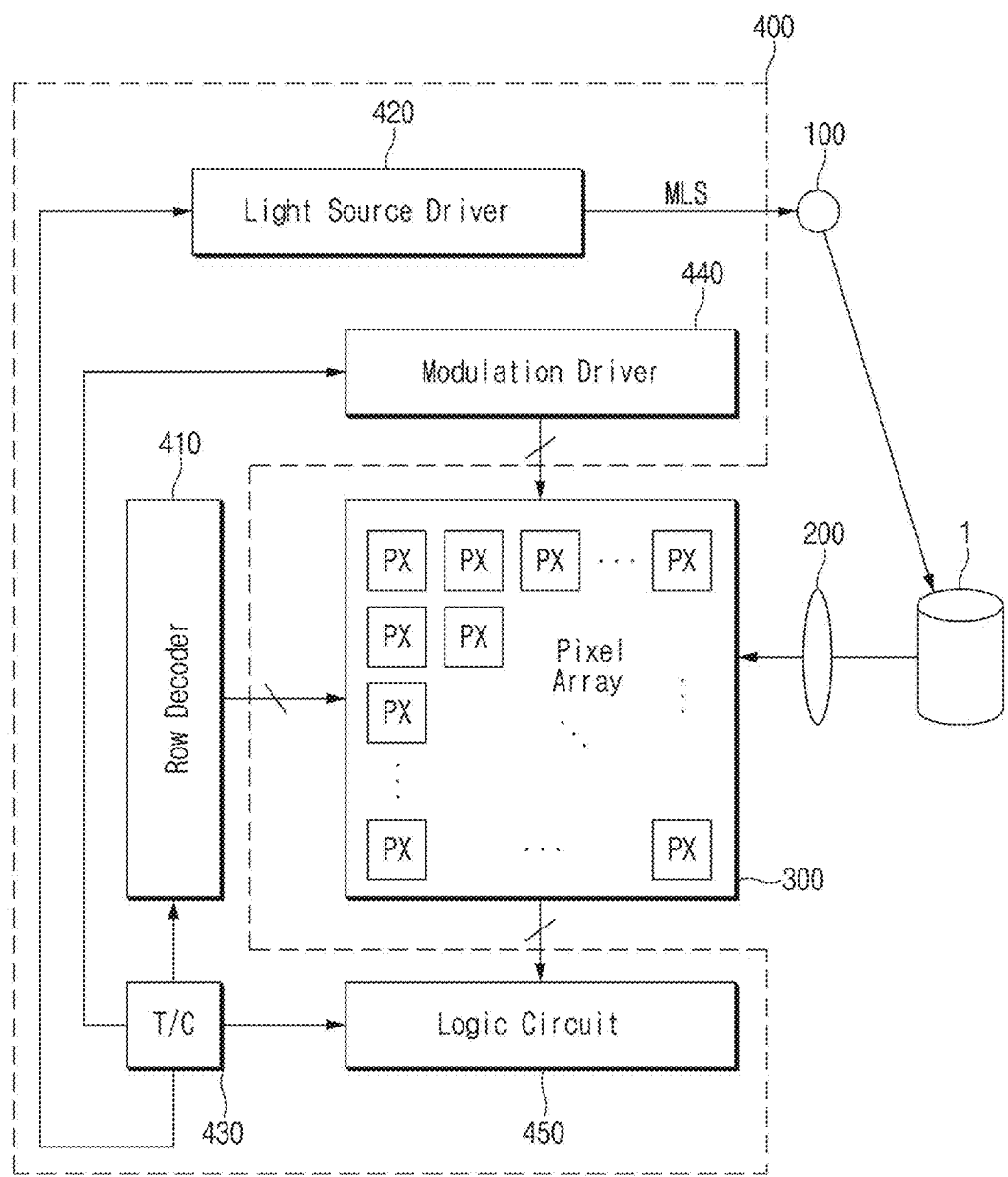
FIG. 1 is a block diagram illustrating an example of an image sensing device based on some implementations of the disclosed technology.

FIG. 1 is a block diagram illustrating an example of an image sensing device based on some implementations of the disclosed technology.

In some implementations, the image sensing device may measure the distance using the time of flight (TOF) principle. In one example, a TOF sensor can work by illuminating a target object with a modulated light source and observing the reflected light. The phase shift between the illumination and the reflection is measured and translated to a distance between the target object and the TOF sensor. The image sensing device may include a light source 100, a lens module 200, a pixel array 300, and a control circuit 400.

The light source 100 may emit light to a target object 1 upon receiving a clock signal MLS from the control circuit 400. In one example, the light source 100 may be a laser diode (LD) or a light emitting diode (LED) for emitting infrared light or visible light. In another example, the light source 100 may be a monochromatic light source combined with a near infrared laser (NIR), a point light source, a white lamp and a monochromator, or a combination of other laser sources. For example, the light source 100 may emit infrared light having a wavelength of 800 nm to 1000 nm. Although FIG. 1 shows only one light source 100 for convenience of description, the scope or spirit of the disclosed technology is not limited thereto, and a plurality of light sources may also be arranged in the vicinity of the lens module 200.

The lens module 200 may collect light reflected from the target object 1, and may allow the collected light to be focused onto pixels (PXs) of the pixel array 300. The lens module 200 may include a focusing lens having a surface formed of glass or plastic or another cylindrical optical element having a surface formed of glass or plastic. The lens module 200 may include a focusing lens having a convex structure.

The pixel array 300 may include unit pixels (PXs) consecutively arranged in a two-dimensional (2D) array in which unit pixels are arranged in rows and columns. The unit pixels (PXs) may convert light received through the lens module 200 into an electrical signal corresponding to the received light such that each unit pixel can output a pixel signal. In some implementations, the pixel signal may be an electrical signal that a TOF sensor unit pixel converts from the reflected light to indicate a time delay based on the distance to the target object 1, instead of indicating a color of the target object 1. Some embodiments of the disclosed technology can implement two mechanisms to allow each unit pixel (PX) to (1) move, in a predetermined direction (i.e., clockwise or counterclockwise), charge carriers (e.g., electrons) that generated by a photoelectric conversion element based on the reflected light and (2) transfer electrons collected by such movement to a plurality of floating diffusion regions. Here, those two mechanisms can be carried out separately from each other. In some implementations, each unit pixel (PX) may include a plurality of circulation gates and a plurality of transfer gates that are formed to surround the photoelectric conversion element. Such circulation gates and transfer gates are operated such that a certain voltage sequentially applies to the circulation gates and a certain voltage sequentially applies to the transfer gates in a consecutive order, clockwise or counterclockwise. As a result, electrons generated in the photoelectric conversion element can move or transfer in a predetermined direction with the changes in the voltage level at the circulation gates and the transfer gates. As described above, when a TOF sensor illuminates a target object with a light source and observes the reflected light, such movement and transmission of electrons that are carried out separately from each other may allow for a more effective analysis on a time delay or phase shift between the illumination and the reflection that is translated to the distance between the TOF sensor and the target object 1. In some embodiments, the structure and operations of the unit pixel (PX) are implemented as discussed below.

The control circuit 400 may control the light source 100 so that light can be sent to the target object 1 at the right timing. The control circuit 400 may also process each pixel signal corresponding to the light reflected from the target object 1 by operating unit pixels (PXs) of the pixel array 300, and may measure a time delay based on the distance to the surface of the target object 1.

In some implementations, the control circuit 400 may include a row decoder 410, a light source driver 420, a timing controller 430, a modulation driver 440, and a logic circuit 450.

The row decoder 410 may activate unit pixels (PXs) of the pixel array 300 in response to a timing signal generated from the timing controller 430. For example, the row decoder 410 may generate a control signal capable of selecting at least one of the plurality of row lines. The control signals may include not only a reset signal needed to initialize the unit pixel (PX), but also other signals needed to transmit tap signals generated from the floating diffusion regions of the unit pixel (PX) to the logic circuit 450.

The light source driver 420 may generate a clock signal MLS capable of operating the light source 100 in response to a control signal from the timing controller 430.

The timing controller 430 may generate a timing signal to control the row decoder 410, the light source driver 420, the modulation driver 440, and the logic circuit 450.

The modulation driver 440 may generate control signals for controlling modulation operations of the unit pixels (PX) based on control signals of the timing controller 430, and may transmit the generated control signals to the pixel array 300. For example, the modulation driver 440 may generate circulation control signals for controlling movement of electrons in the photoelectric conversion element of the unit pixel (PX) and transfer control signals for sequentially transmitting the electrons to the floating diffusion regions, such that the modulation driver 440 can provide the circulation control signals and the transfer control signals to the pixel array 300.

The logic circuit 450 may process pixel signals received from the pixel array 300 based on the timing signals of the timing controller 430, and may thus calculate a time delay based on the distance to the target object 1. The logic circuit 450 may include a correlated double sampler (CDS) circuit for performing correlated double sampling (CDS) on the pixel signals generated from the pixel array 300. In addition, the logic circuit 450 may include an analog-to-digital converter (ADC) for converting output signals of the CDS circuit into digital signals.

Figure 2:
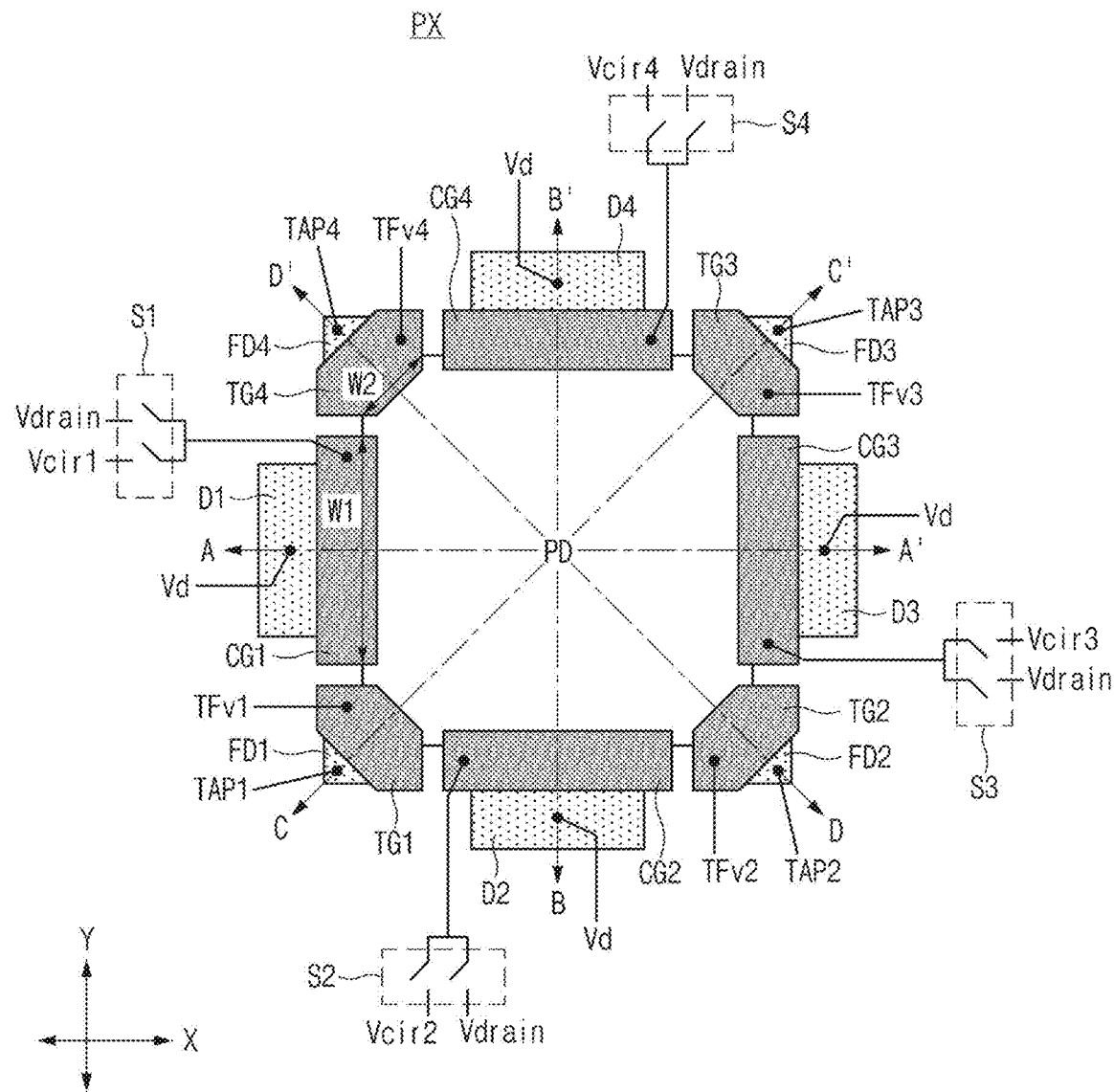
FIG. 2 is a plan view illustrating an example of a unit pixel formed in a pixel array shown in FIG. 1 based on some implementations of the disclosed technology.

FIG. 2 is a plan view illustrating an example of a unit pixel (PX) formed in the pixel array shown in FIG. 1 based on some implementations of the disclosed technology.

In some implementations, each unit pixel (PX) may include a photoelectric conversion element (PD), a plurality of floating diffusion regions FD1-FD4, a plurality of drain nodes D1-D4, a plurality of transfer gates TG1-TG4, and a plurality of circulation gates CG1-CG4.

The photoelectric conversion element (PD) may be formed in a semiconductor substrate. The photoelectric conversion element (PD) may generate charge carriers by converting light beams that are reflected from the target object 1 and incident upon the semiconductor substrate. For example, the photoelectric conversion element (PD) may generate a pair of an electron and a hole in response to such reflected light beams. The photoelectric conversion element (PD) may include a stacked structure in which different types of impurity regions are vertically stacked on top of one another. For example, the photoelectric conversion element may include a photodiode (PD) or a pinned photodiode (PPD) in which an N-type impurity region and a P-type impurity region are vertically stacked on top of one another.

Each of the floating diffusion regions FD1-FD4 may be located at one side of each of the corresponding transfer gates TG1-TG4, and may hold electrons transferred through the transfer gates TG1-TG4. Signals corresponding to the amount of charge carriers (e.g., electrons) stored in the floating diffusion regions FD1-FD4 may be respectively output as tap signals TAP1-TAP4. The tap signals TAP1-TAP4 may be applied to a gate of the corresponding source follower transistor (not shown) through a conductive line. For example, the floating diffusion regions FD1-FD4 may be coupled to a gate of the corresponding source follower transistor (not shown) through a conductive line. In addition, the tap signals TAP1-TAP4 may be applied to a terminal of the corresponding reset transistor (not shown) through a conductive line. For example, the floating diffusion regions FD1-FD4 may be coupled to a terminal of the corresponding reset transistor (not shown) through a conductive line. Each of the floating diffusion regions FD1-FD4 may include an impurity region formed by implanting N-type impurities into the semiconductor substrate to a predetermined depth.

The drain nodes D1-D4 may be respectively located at one sides of the corresponding circulation gates CG1-CG4, and each of the drain nodes D1-D4 may be coupled to an input terminal of a drain voltage (Vd) through a conductive line. The drain voltage (Vd) may be at a low-voltage (e.g., a ground voltage) level during a modulation period, during which charge carriers (photo-generated electrons) generated by the photoelectric conversion element (PD) are collected and then transferred to the floating diffusion regions FD1-FD4 through the transfer gates TG1-TG4, and may be at a high-voltage (e.g., a power-supply voltage) level during a reading out period, which follows the modulation period. Each of the drain nodes D1-D4 may include an impurity region formed by implanting N-type impurities into the semiconductor substrate to a predetermined depth.

The transfer gates TG1-TG4 may transfer electrons generated in the photoelectric conversion element (PD) to the floating diffusion regions FD1-FD4 upon receipt of transfer control signals TFv1-TFv4. The transfer control signals TFv1-TFv4 may be received from the modulation driver 440.

The circulation gates CG1-CG4 may operate in response to circulation control signals Vcir1-Vcir4 during the modulation period, such that charge carriers (electrons) generated in the photoelectric conversion element (PD) can move in a predetermined direction in the photoelectric conversion element (PD) (e.g., in a counterclockwise direction). During the reading out period, the circulation gates CG1-CG4 may fix the voltage level of the photoelectric conversion element (PD) at a drain voltage (Vd) based on a draining control signal (Vdrain). The circulation control signals Vcir1-Vcir4 and the draining control signal (Vdrain) may be received from the modulation driver 440.

In some implementations, the circulation gates CG1-CG4 may be respectively located in regions corresponding to four sides of a rectangular shape formed to surround the photoelectric conversion element (PD) when viewed from above. During the modulation period, the circulation gates CG1-CG4 may sequentially receive the circulation control signals Vcir1-Vcir4 in a consecutive order, clockwise or counterclockwise, such that the circulation gates CG1-CG4 can partially generate an electric field in the edge region of the photoelectric conversion element (PD) and can change the electric field in the corresponding direction at predetermined time intervals. As such, electrons of the photoelectric conversion element (PD) may move in the direction that changes based on the electric field that are generated and changed as discussed above.

In this case, the circulation control signals Vcir1-Vcir4 may have a voltage level that is not high enough to electrically couple the photoelectric conversion element (PD) to the drain nodes D1-D4. In other words, during the modulation period, the circulation gates CG1-CG4 may serve to move electrons of the photoelectric conversion element (PD) from one place to another place in the photoelectric conversion element (PD).

During the reading out period, the circulation gates CG1-CG4 may fix the voltage level of the photoelectric conversion element (PD) at the drain voltage (Vd) in response to the draining control signal (Vdrain), such that the circulation gates CG1-CG4 can prevent noise from being introduced into the photoelectric conversion element (PD), preventing signal distortion. For example, when the draining control signal (Vdrain) is activated to a high level, the draining control signal (Vdrain) may have a high voltage by which the circulation gates CG1-CG4 can electrically couple the photoelectric conversion element (PD) to the drain nodes D1-D4. That is, the activated draining control signal (Vdrain) may be at a higher voltage than the activated circulation control signals Vcir1-Vcir4.

Therefore, during the reading out period, the draining control signal (Vdrain) may be activated to a high level. In this case, the drain nodes D1-D4 are electrically coupled to the photoelectric conversion element (PD), such that the voltage level of the photoelectric conversion element (PD) may be fixed to a high drain voltage (Vd). The draining control signal (Vdrain) may be deactivated to a low level during the modulation period.

During the modulation period, each of the circulation gates CG1-CG4 may receive the circulation control signals Vcir1-Vcir4 in response to the switching operations of corresponding one of the switching elements S1-S4. During the reading out period, each of the circulation gates CG1-CG4 may receive the draining control signal (Vdrain) in response to the switching operations of the switching elements S1-S4.

In order to generate and change an electric field at higher speed in as large a region as possible, the circulation gates CG1-CG4 may enable the region formed to overlap with the photoelectric conversion element (PD) in each circulation gate CG1-CG4 to have a maximum length (or a maximum width) W1. For example, the width (W1) of each of the circulation gates CG1-CG4 may be larger than the length (i.e., width) (W2) of the region formed to overlap with the photoelectric conversion element (PD) in each of the transfer gates TG1-TG4. When viewed from above, each of the circulation gates CG1-CG4 may be formed in a rectangular shape. For example, each of the circulation gates CG1 and CG3 may be formed in a rectangular shape in which the length of the second direction (i.e., Y-axis direction) of each of the circulation gates CG1 and CG3 is longer than the length of the first direction (i.e., X-axis direction) of each of the circulation gate CG1 and CG3, and each of the circulation gates CG2 and CG4 may be formed in a rectangular shape in which the length of the first direction (i.e., X-axis direction) is longer than the length of the second direction (i.e., Y-axis direction).

The transfer gates TG1-TG4 and the circulation gates CG1-CG4 may be spaced apart from each other by a predetermined distance while simultaneously being alternately arranged over the semiconductor substrate. When viewed from above, the transfer gates TG1-TG4 and the circulation gates CG1-CG4 may be arranged in a ring shape formed to surround the photoelectric conversion element (PD).

The circulation gates CG1 and CG3 may be located at both sides of the photoelectric conversion element (PD) in the first direction over the semiconductor substrate, and the circulation gates CG2 and CG4 may be located at both sides of the photoelectric conversion element (PD) in the second direction. For example, the circulation gates CG1-CG4 may be located in the regions corresponding to four sides of the rectangular shape formed to surround the photoelectric conversion element (PD), and some parts of the circulation gates CG1-CG4 may overlap with the photoelectric conversion element (PD).

Each of the transfer gates TG1-TG4 can be spaced apart from two contiguous circulation gates by a predetermined distance, and at the same time can be disposed between the corresponding circulation gates. For example, the transfer gates TG1-TG4 may be located in the regions corresponding to vertexes of the rectangular shape, and some parts of the transfer gates TG1-TG4 may overlap with the photoelectric conversion element (PD).

Figure 3A:
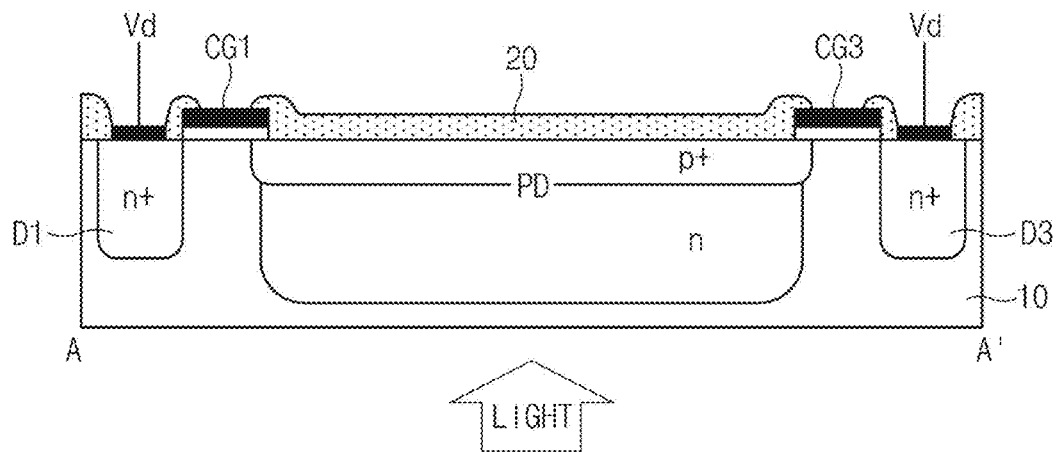
FIG. 3A is a cross-sectional view illustrating an example of a unit pixel taken along the line A-A' shown in FIG. 2 based on some implementations of the disclosed technology.
Figure 3B:
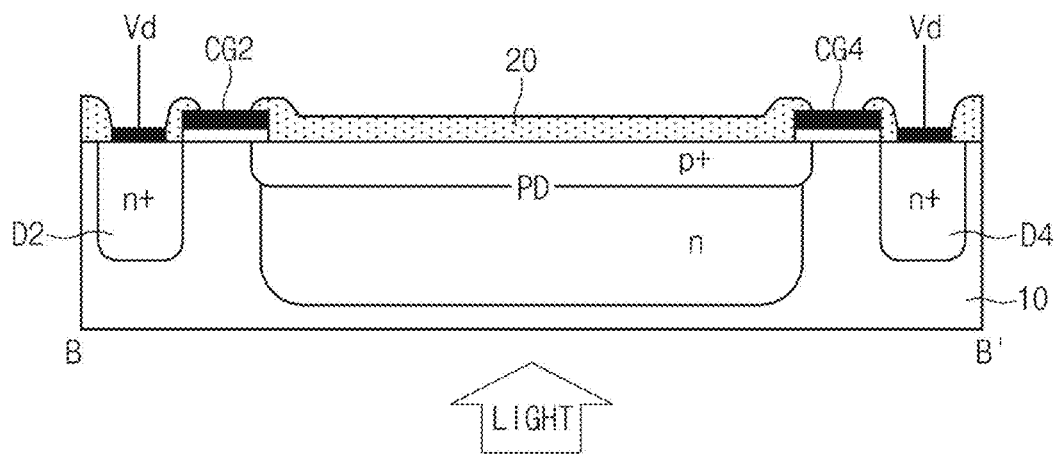
FIG. 3B is a cross-sectional view illustrating an example of a unit pixel taken along the line B-B' shown in FIG. 2 based on some implementations of the disclosed technology.
Figure 3C:
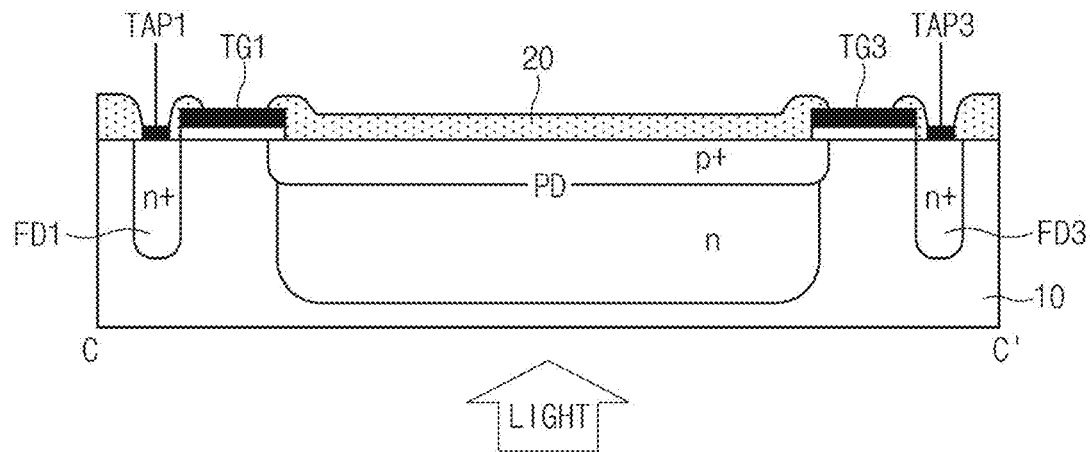
FIG. 3C is a cross-sectional view illustrating an example of a unit pixel taken along the line C-C' shown in FIG. 2 based on some implementations of the disclosed technology.
Figure 3D:
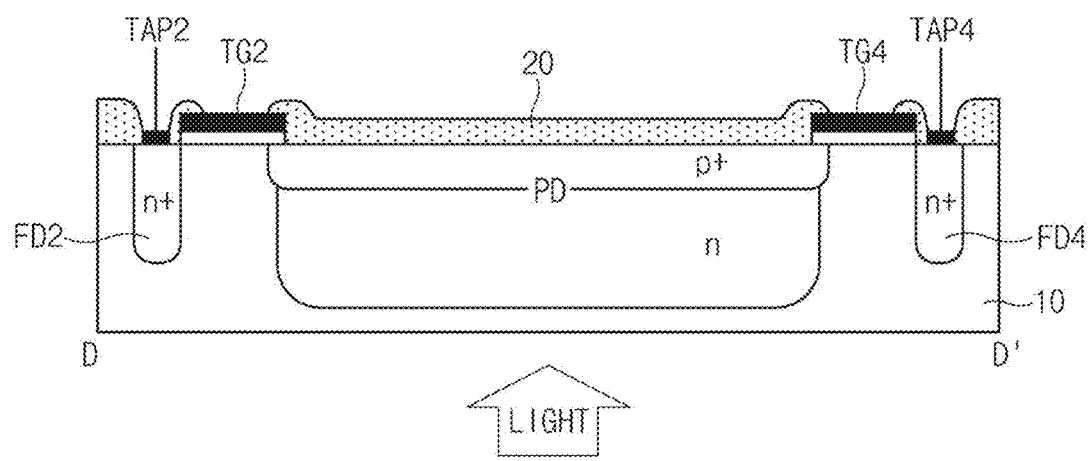
FIG. 3D is a cross-sectional view illustrating an example of a unit pixel taken along the line D-D' shown in FIG. 2 based on some implementations of the disclosed technology.

FIG. 3A is a cross-sectional view illustrating the unit pixel taken along the line A-A' shown in FIG. 2. FIG. 3B is a cross-sectional view illustrating the unit pixel taken along the line B-B' shown in FIG. 2. FIG. 3C is a cross-sectional view illustrating the unit pixel taken along the line C-C' shown in FIG. 2. FIG. 3D is a cross-sectional view illustrating the unit pixel taken along the line D-D' shown in FIG. 2.

Referring to FIG. 3A, the semiconductor substrate 10 may include a first surface upon which reflected light is incident and a second surface facing the first surface.

The photoelectric conversion element (PD) may be located at the center portion of the unit pixel (PX) in the semiconductor substrate 10, and may include a stacked structure in which the N-type impurity region (n) and the P-type impurity region (p+) are vertically stacked. The photoelectric conversion element (PD) may generate charge carriers by performing photoelectric conversion of incident light (reflected light) received through the first surface of the semiconductor substrate 10.

The drain nodes D1 and D3 may be located at both sides of the photoelectric conversion element (PD) in a manner that the drain nodes D1 and D3 can be spaced apart from the photoelectric conversion element (PD) by a predetermined distance in the first direction within the semiconductor substrate 10. Each of the drain nodes D1 and D3 may include an impurity region formed by implanting N-type high-density impurities (n+) into the semiconductor substrate 10. Each of the drain nodes D1 and D3 may be coupled to an input terminal of the drain voltage (Vd) through a conductive line.

The circulation gate CG1 may be formed between the photoelectric conversion element (PD) and the drain node D1 at the second surface of the semiconductor substrate 10, and the circulation gate CG3 may be formed between the photoelectric conversion element (PD) and the drain node D3 at the second surface of the semiconductor substrate 10. For example, the drain node D1 and the photoelectric conversion element (PD) may be located at both sides of the circulation gate CG1 in a manner that the drain node D1 and the photoelectric conversion element (PD) are coupled to the circulation gate CG1. As a result, the drain node D1 and the photoelectric conversion element (PD) may be used as source/drain regions of the circulation gate CG1. In addition, the drain node D3 and the photoelectric conversion element (PD) may be located at both sides of the circulation gate CG3 in a manner that the drain node D3 and the photoelectric conversion element (PD) are coupled to the circulation gate CG3. As a result, the drain node D3 and the photoelectric conversion element (PD) may be used as the source/drain regions of the circulation gate CG3.

The insulation layer 20 may be formed over the photoelectric conversion element (PD) at the second surface of the semiconductor substrate 10.

Referring to FIG. 3B, the photoelectric conversion element (PD) may be located at the center portion of the unit pixel (PX), and may include a stacked structure in which the N-type impurity region (n) and the P-type impurity region (p+) are vertically stacked in the semiconductor substrate 10.

The drain nodes D2 and D4 may be located at both sides of the photoelectric conversion element (PD) while simultaneously being spaced apart from the photoelectric conversion element (PD) by a predetermined distance in the second direction in the semiconductor substrate 10. Each of the drain nodes D2 and D4 may include an impurity region formed by implanting N-type high-density impurities (n+) into the semiconductor substrate 10. Each of the drain nodes D2 and D4 may be coupled to an input terminal of the drain voltage (Vd) through a conductive line.

The circulation gate CG2 may be formed between the photoelectric conversion element (PD) and the drain node D2 at the second surface of the semiconductor substrate 10, and the circulation gate CG4 may be formed between the photoelectric conversion element (PD) and the drain node D4 at the second surface of the semiconductor substrate 10. For example, the drain node D2 and the photoelectric conversion element (PD) may be located at both sides of the circulation gate CG2 in a manner that the drain node D2 and the photoelectric conversion element (PD) are coupled to the circulation gate CG2. As a result, the drain node D2 and the photoelectric conversion element (PD) may be used as the source/drain regions of the circulation gate CG2. In addition, the drain node D4 and the photoelectric conversion element (PD) are located at both sides of the circulation gate CG4 in a manner that the drain node D4 and the photoelectric conversion element (PD) are coupled to the circulation gate CG4. As a result, the drain node D4 and the photoelectric conversion element (PD) may be used as the source/drain regions of the circulation gate CG4.

The insulation layer 20 may be formed over the photoelectric conversion element (PD) at the second surface of the semiconductor substrate 10.

That is, the cross-sectional structure in the first direction of the unit pixel (PX) may be identical in shape to the cross-sectional structure in the second direction of the unit pixel (PX).

Referring to FIG. 3C, the photoelectric conversion element (PD) may be located at the center portion of the unit pixel (PX), and may include a stacked structure in which the N-type impurity region (n) and the P-type impurity region (p+) are vertically stacked in the semiconductor substrate 10.

The floating diffusion (FD) regions FD1 and FD3 may be located at both sides of the photoelectric conversion element (PD) while simultaneously being spaced apart from the photoelectric conversion element (PD) by a predetermined distance in the third direction in the semiconductor substrate 10. In this case, the third direction may refer to a specific direction formed to penetrate the spacing between the first direction and the second direction.

Each of the floating diffusion regions FD1 and FD3 may include an impurity region formed by implanting N-type high-density impurities (n+) into the semiconductor substrate 10. The floating diffusion region FD1 may output the tap signal TAP1 through a conductive line, and the floating diffusion region FD3 may output the tap signal TAP3 through a conductive line. The tap signal TAP1 may refer to a signal corresponding to the amount of charge carriers (e.g., electrons) transferred to the floating diffusion region FD1 by the transfer gate TG1, and the tap signal TAP3 may refer to a signal corresponding to the amount of charge carriers (e.g., electrons) transferred to the floating diffusion region FD3 by the transfer gate TG3.

The tap signals TAP1 and TAP3 may be applied to gates of the corresponding source follower transistor (not shown) through conductive lines. In addition, the tap signals TAP1 and TAP3 may be applied to a terminal of the corresponding reset transistor (not shown) through a conductive line.

The transfer gate TG1 may be formed between the photoelectric conversion element (PD) and the floating diffusion region FD1 at the second surface of the semiconductor substrate 10, and the transfer gate TG3 may be formed between the photoelectric conversion element (PD) and the floating diffusion region FD3 at the second surface of the semiconductor substrate 10. That is, each of the transfer gates TG1 and TG3 may be used as a gate of the transistor in which the photoelectric conversion element (PD) and the floating diffusion regions FD1 and FD3 are used as the source/drain regions.

The insulation layer 20 may be formed over the photoelectric conversion element (PD) at the second surface of the semiconductor substrate 10.

Referring to FIG. 3D, the photoelectric conversion element (PD) may be located at the center portion of the unit pixel (PX), and may include a stacked structure in which the N-type impurity region (n) and the P-type impurity region (p+) are vertically stacked in the semiconductor substrate 10.

The floating diffusion regions FD2 and FD4 may be located at both sides of the photoelectric conversion element (PD) while simultaneously being spaced apart from the photoelectric conversion element (PD) by a predetermined distance in the fourth direction perpendicular to the third direction within the semiconductor substrate 10.

Each of the floating diffusion regions FD2 and FD4 may include an impurity region formed by implanting N-type high-density impurities (n+) into the semiconductor substrate 10. The floating diffusion region FD2 may output the tap signal TAP2 through a conductive line, and the floating diffusion region FD4 may output the tap signal TAP4 through a conductive line. The tap signal TAP2 may refer to a signal corresponding to the amount of charge carriers (e.g., electrons) transferred to the floating diffusion region FD2 by the transfer gate TG2, and the tap signal TAP4 may refer to a signal corresponding to the amount of charge carriers (e.g., electrons) transferred to the floating diffusion region FD4 by the transfer gate TG4.

The tap signals TAP2 and TAP4 may be applied to gates of the corresponding source follower transistor (not shown) through conductive lines. In addition, the tap signals TAP2 and TAP4 may be applied to a terminal of the corresponding reset transistor (not shown) through a conductive line.

The transfer gate TG2 may be formed between the photoelectric conversion element (PD) and the floating diffusion region FD2 at the second surface of the semiconductor substrate 10, and the transfer gate TG4 may be formed between the photoelectric conversion element (PD) and the floating diffusion region FD4 at the second surface of the semiconductor substrate 10. That is, each of the transfer gates TG2 and TG4 may be used as a gate of the transistor in which the photoelectric conversion element (PD) and the floating diffusion regions FD2 and FD4 are used as the source/drain regions.

The insulation layer 20 may be formed over the photoelectric conversion element (PD) at the second surface of the semiconductor substrate 10.

Figure 4A:
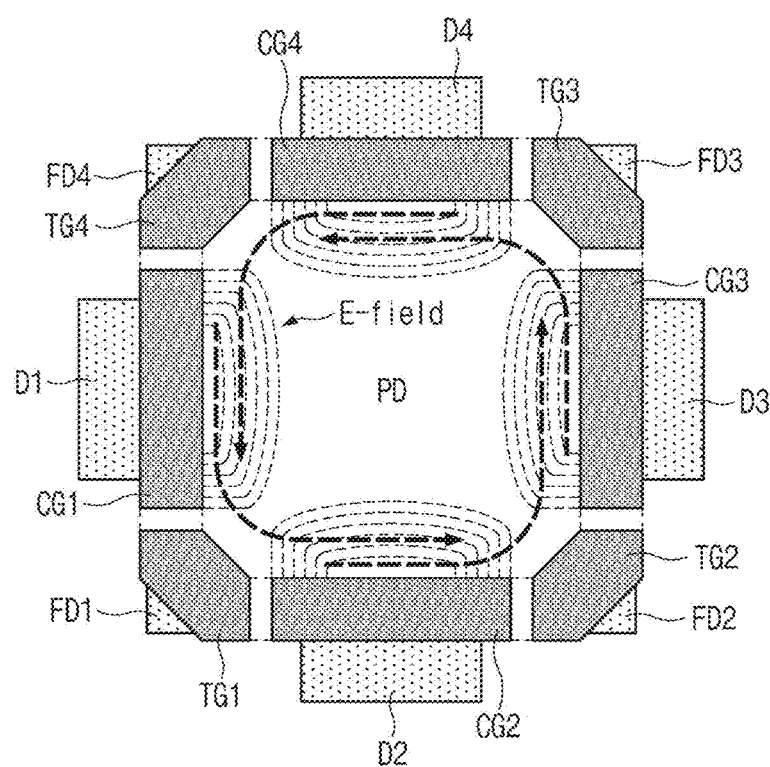
FIG. 4A illustrates how electrons are moving by circulation gates in the unit pixel shown in FIG. 2 based on some implementations of the disclosed technology.

FIG. 4A illustrates how electrons are moving by the circulation gates in the unit pixel shown in FIG. 2.

Referring to FIG. 4A, when the circulation control signals Vcir1-Vcir4 are respectively applied to the circulation gates CG1-CG4, the electric field may be formed in the peripheral region of the circulation gates CG1-CG4, such that electrons generated by the photoelectric conversion element (PD) may be gathered near the circulation gates CG1-CG4 at the edge region of the photoelectric conversion element (PD). In this case, when the voltage level of each of the circulation control signals Vcir1-Vcir4 is less than a threshold level that can create a channel capable of electrically coupling the photoelectric conversion element (PD) to each of the drain nodes D1-D4, electrons can be accumulated near the circulation gates CG1-CG4 without moving to the drain nodes D1-D4.

However, as can be seen from FIG. 2, the circulation gates CG1-CG4 are disposed to surround the upper portion of the photoelectric conversion element (PD). The circulation control signals Vcir1-Vcir4 are not applied simultaneously, but sequentially applied to the circulation gates CG1-CG4 in a consecutive order, clockwise or counterclockwise, and thus electrons may move along the edge region of the photoelectric conversion element (PD) according to a desired sequence of operations of the circulation gates CG1-CG4. As such, electrons can move in a predetermined direction within the edge region of the photoelectric conversion element (PD).

In some implementations, at a first point in time, the circulation control signal (Vcir1) is applied to the circulation gate CG1, electrons generated by the photoelectric conversion element (PD) can be accumulated near the circulation gate CG1 by the electric field formed in the peripheral region of the circulation gate CG1.

After a predetermined time period, at a second point in time, the circulation control signal (Vcir2) is applied to the circulation gate CG2 contiguous to the circulation gate CG1, and the circulation control signal (Vcir1) ceases to be applied to the circulation gate CG1. Thus, electrons accumulated near the circulation gate CG1 may move toward the circulation gate CG2.

After a predetermined time period, at a third point in time, the circulation control signal (Vcir3) is applied to the circulation gate CG3 contiguous to the circulation gate CG2, and the circulation control signal (Vcir2) ceases to be applied to the circulation gate CG2. Thus, electrons accumulated near the circulation gate CG2 may move toward the circulation gate CG3.

After a predetermined time period, at a fourth point in time, the circulation control signal (Vcir4) is applied to the circulation gate CG4 contiguous to the circulation gate CG3, and the circulation control signal (Vcir3) ceases to be applied to the circulation gate CG3. Thus, electrons accumulated near the circulation gate CG3 may move toward the circulation gate CG4.

After a predetermined time period, at a fifth point in time, the circulation control signal (Vcir1) is applied to the circulation gate CG1 contiguous to the circulation gate CG4, and the circulation control signal (Vcir4) ceases to be applied to the circulation gate CG4. Thus, electrons accumulated near the circulation gate CG4 may move toward the circulation gate CG1.

If the above-mentioned operations are consecutively and repeatedly carried out, electrons can be circulated along the edge region of the photoelectric conversion element (PD).

Figure 4B:
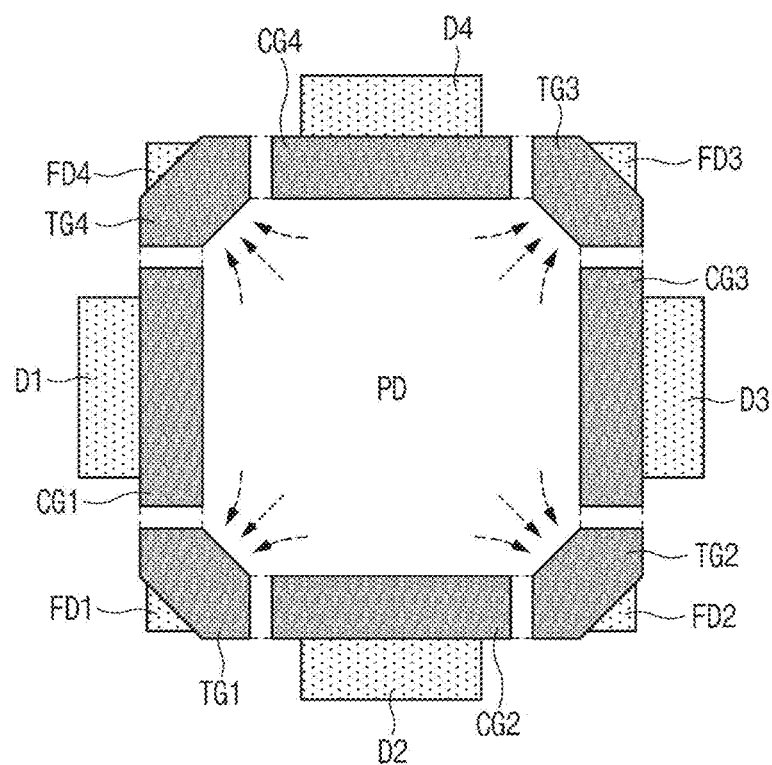
FIG. 4B illustrates how the unit pixel shown in FIG. 2 transfers electrons to a floating diffusion region by transfer gates based on some implementations of the disclosed technology.

FIG. 4B illustrates how the unit pixel shown in FIG. 2 transfers electrons to the floating diffusion region by transfer gates.

In some implementations, when the transfer control signals TFv1-TFv4 are applied to the transfer gates TG1-TG4, an electrical channel is created in the semiconductor substrate 10 below the transfer gates TG1-TG4 to couple the photoelectric conversion element (PD) to the floating diffusion regions FD1-FD4. The electrons generated by the photoelectric conversion element (PD) can be transferred to the floating diffusion (FD) regions FD1-FD4 through the channel.

The transfer control signals TFv1-TFv4 are not applied simultaneously, but sequentially applied to the transfer gates TG1-TG4 in a consecutive order, clockwise or counterclockwise. The transfer control signals TFv1-TFv4 may be sequentially applied to the transfer gates TG1-TG4 according to a desired sequence of operations of the circulation gates CG1-CG4 shown in FIG. 4A.

For example, in a situation in which electrons accumulated near the circulation gate CG1 move toward the circulation gate CG2, the transfer control signal (TFv1) can be applied only to the transfer gate TG1 located between the circulation gates CG1 and CG2. In this case, the transfer control signal (TFv1) may have a higher voltage level than each of the circulation control signals Vcir1 and Vcir2.

As described above, in the arrangement structure in which the transfer gate TG1 and the circulation gates CG1 and CG2 are arranged in an L-shape structure, in a situation in which the transfer gate TG1 is located at a vertex position and at the same time the signal (TFv1) applied to the transfer gate TG1 is at a higher voltage level than each of the signals Vcir1 and Vcir2 applied to the circulation gates CG1 and CG2, most parts of electrons collected by the circulation gates CG1 and CG2 and the transfer gate TG1 may be intensively collected in the region located close to the transfer gate TG1. That is, most parts of the collected electrons may be concentrated in a narrow region. Therefore, even when the transfer gate TG1 having a relatively small size is used, electrons can be rapidly transferred to the floating diffusion region FD1.

In the same manner as described above, in a situation in which electrons accumulated near the circulation gate CG2 move toward the circulation gate CG3, the transfer control signal (TFv2) can be applied only to the transfer gate TG2 located between the circulation gates CG2 and CG3. In addition, if electrons accumulated near the circulation gate CG3 move toward the circulation gate CG4, the transfer control signal (TFv3) can be applied only to the transfer gate TG3 located between the circulation gates CG3 and CG4. Likewise, if electrons accumulated near the circulation gate CG4 move toward the circulation gate CG1, the transfer control signal (TFv4) can be applied only to the transfer gate TG4 located between the circulation gates CG4 and CG1.

Figure 5:
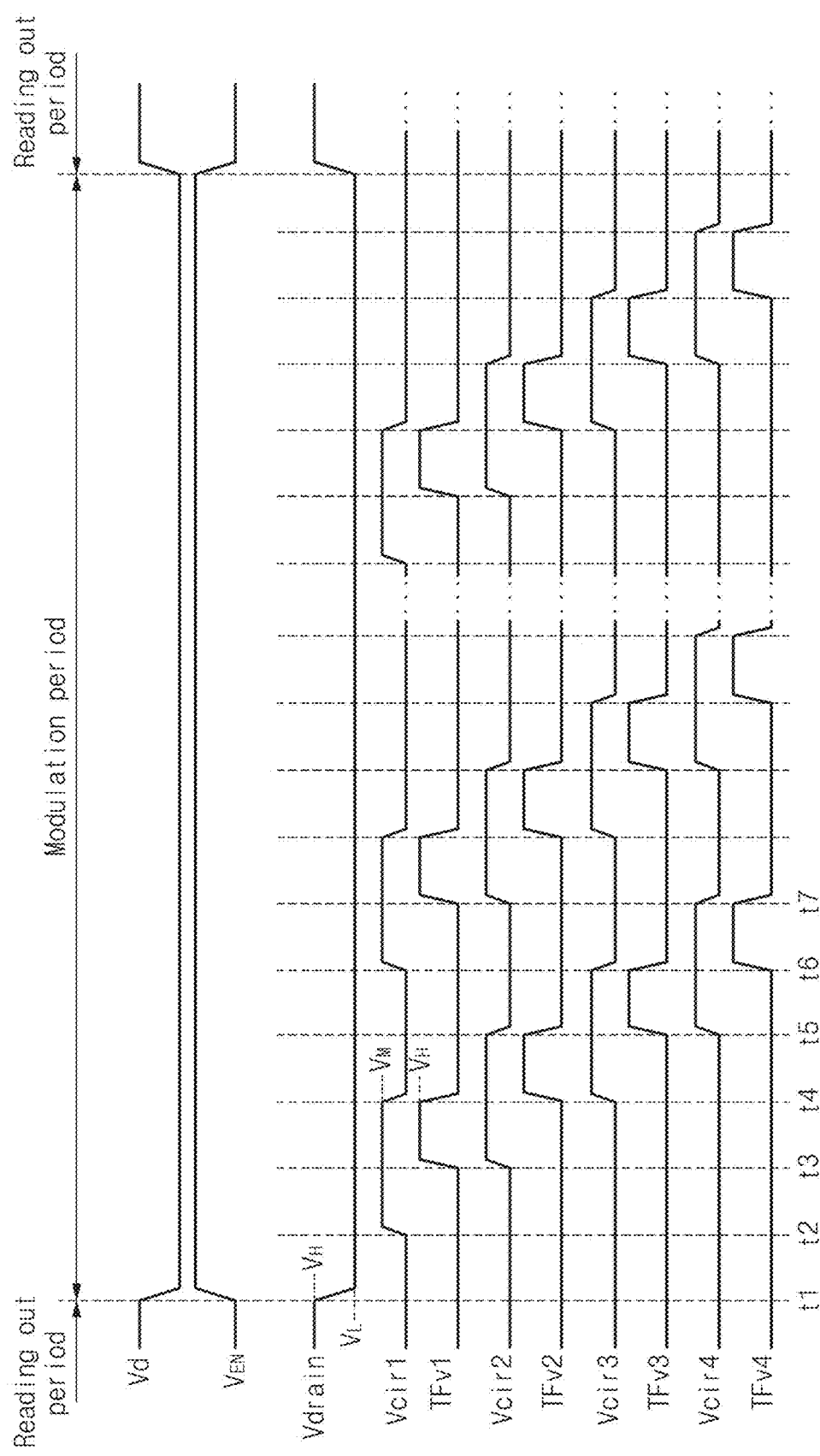
FIG. 5 is a timing diagram illustrating operations of the unit pixel shown in FIG. 2 based on some implementations of the disclosed technology.

FIG. 5 is a timing diagram illustrating operations of the unit pixel shown in FIG. 2. FIGS. 6A to 6H are schematic diagrams illustrating operations of the unit pixel configured to operate in steps shown in FIG. 5. As can be seen from the time points t1-t7 shown in FIG. 5, time intervals between contiguous time points may be identical to each other. In FIGS. 6A to 6H, the outermost line is a line that schematically shows how electrons are concentrated and moved by operations of the circulation gates or the transfer gates.

Figure 6A:
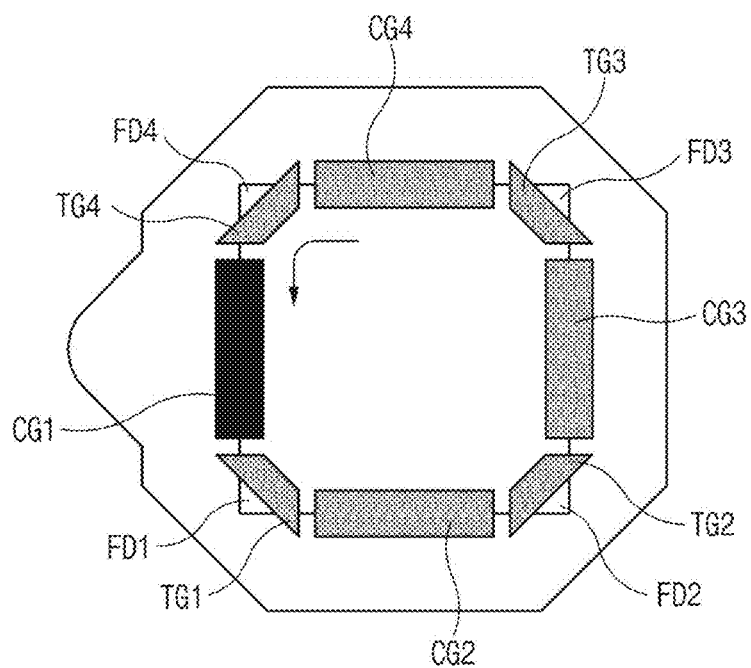
FIGS. 6A to 6H are schematic diagrams illustrating operations of the unit pixel configured to operate in steps shown in FIG. 5 based on some implementations of the disclosed technology.

Referring to FIGS. 5 and 6A, if the enable signal ($V_{EN}$) is activated to a high level at the time point (t1), the modulation period moving and transferring electrons may be started. The period in which the modulation period is ended may be used as the reading out period for reading out the tap signals TAP1-TAP4 corresponding to the amount of charge carriers (e.g., electrons) having been transferred to the floating diffusion regions FD1-FD4 during the modulation period.

In the modulation period, the drain voltage (Vd) applied to the drain nodes D1-D4 may be at a low-voltage (e.g., a ground voltage) level. In the reading out period, the drain voltage (Vd) applied to the drain nodes D1-D4 may be at a high-voltage (e.g., a power-supply voltage) level. For example, if the drain voltage (Vd) is at a high-voltage level even in the modulation period, the drain voltage (Vd) can prevent electrons collected by the circulation gate from moving toward the transfer gate, such that the drain voltage (Vd) may be at a low-voltage level in the modulation period.

In the modulation period, the draining control signal (Vdrain) for fixing the photoelectric conversion element (PD) to the drain voltage (Vd) may also be at a low-voltage ($V_L$) level. In the reading out period, the draining control signal (Vdrain) may be at a high-voltage ($V_H$) level.

After a predetermined time has passed since the beginning of the modulation period, the circulation control signal (Vcir1) may be activated at the time point (t2). In other words, the circulation control signal (Vcir1) may be applied to the circulation gate CG1 at the time point (t2). In this case, the circulation control signal (Vcir1) may have the voltage ($V_M$) by which the drain node D1 is not electrically coupled to the photoelectric conversion element (PD). The circulation control signal (Vcir1) may be activated for a predetermined time period t2-t4.

Since the circulation control signal (Vcir1) is applied to the circulation gate CG1, the electric field may be formed in the region contiguous to the circulation gate CG1 at the edge region of the photoelectric conversion element (PD). As a result, electrons generated by photoelectric conversion of reflected light in the photoelectric conversion element (PD) may move toward the circulation gate CG1 by the electric field, such that the electrons are collected at a region near the circulation gate CG1.

Figure 6B:
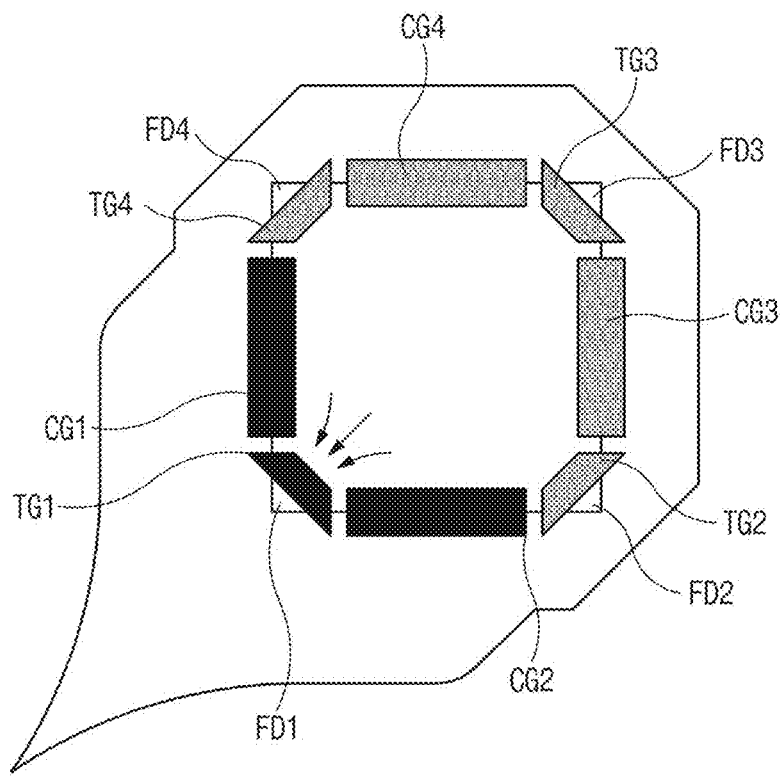

Referring to FIGS. 5 and 6B, after a predetermined time from the expiration of the time point (t2), the transfer control signal (TFv1) and the circulation control signal (Vcir2) may be activated at the time point (t3). For example, in the situation in which the circulation control signal (Vcir1) is still activated, if the circulation control signal (Vcir2) is applied to the circulation gate CG2 and at the same time the transfer control signal (TFv1) is applied to the transfer gate TG1, the circulation gates CG1 and CG2 and the transfer gate TG1 can operate at the same time. In this case, the transfer control signal (TFv1) may have a higher voltage ($V_H$) than each of the circulation control signals Vcir1 and Vcir2, as represented by "$V_M<V_H$". The transfer control signal (TFv1) may be activated for a predetermined time period t3-t4, and the circulation control signal (Vcir2) may be activated for a predetermined time period t3-t5.

Therefore, electrons collected near the circulation gate CG1 during the time period t2-t3 may move toward the transfer gate TG1. In addition, electrons additionally collected by the transfer gate TG1 and the circulation gates CG1 and CG2 during the time period t3-t4 may also move toward the transfer gate TG1.

That is, whereas the circulation gates CG1 and CG2 and the transfer gate TG1 are arranged in an L-shape structure, the transfer gate TG1 is arranged at a vertex position and a relatively higher voltage is applied to the transfer gate TG1, such that electrons can be intensively collected in the region (i.e., the vertex region) located close to the transfer gate TG1.

The collected electrons can be transferred to the floating diffusion region FD1 by the transfer gate TG1. That is, electrons are intensively collected in a narrow vertex region, such that electrons can be rapidly transferred to the floating diffusion region FD1 using a small-sized transfer gate TG1.

Figure 6C:
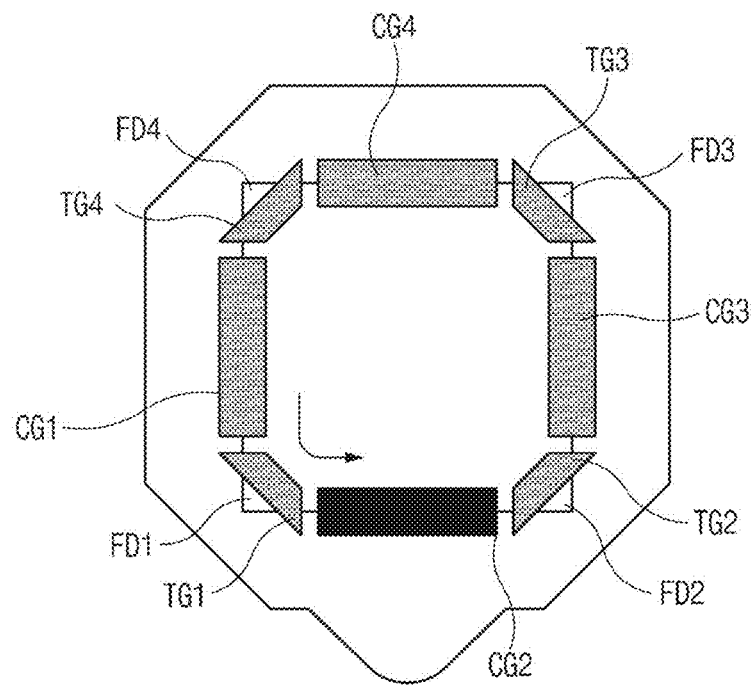
Figure 6D:
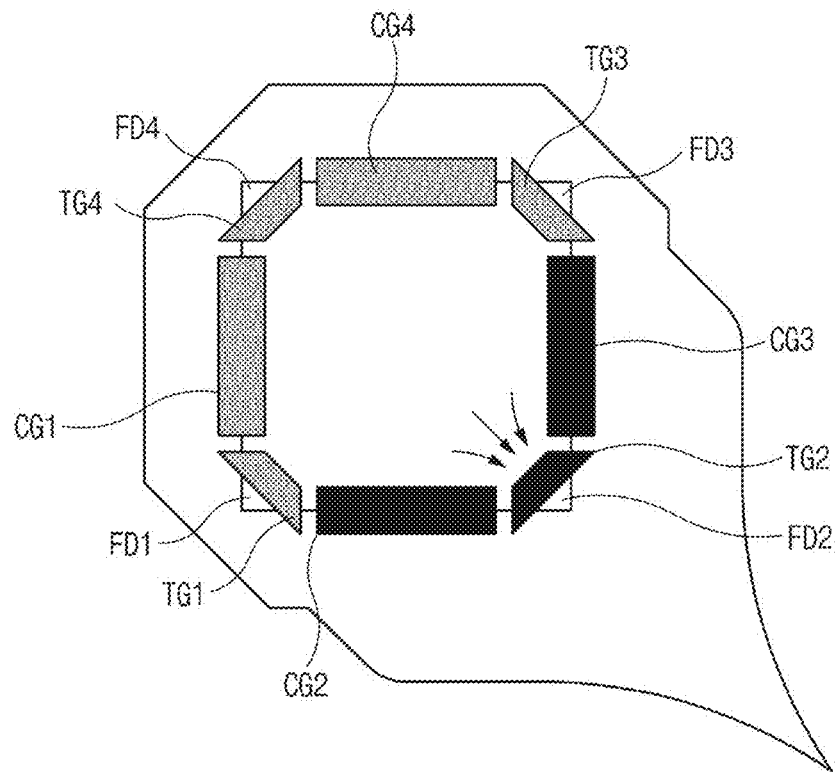

Referring to FIGS. 5, 6C and 6D, the circulation control signal (Vcir1) and the transfer control signal (TFv1) may be deactivated at the time point (t4), and the transfer control signal (TFv2) and the circulation control signal (Vcir3) may be activated at the time point (t4). That is, the transfer gate TG1 and the circulation gate CG1 that are located at one side of the circulation gate CG2 may stop operation, and the transfer gate TG2 and the circulation gate CG3 that are located at the other side of the circulation gate CG2 may start operation. In this case, the transfer control signal (TFv2) may have a higher voltage ($V_H$) than the circulation control signal (Vcir3).

However, although the transfer control signal (TFv2) and the circulation control signal (Vcir3) are activated, a predetermined time (i.e., a rising time) may be consumed until the voltage levels of the control signals TFv2 and Vcir3 reach a predetermined level at which the gates TG2 and CG3 can actually operate. That is, there may occur a time period in which the transfer gate TG1 stops operation and the transfer gate TG2 is not yet operated.

Therefore, the circulation control signal (Vcir2) is continuously activated until reaching the time point (t5). As a result, during a predetermined time in which the transfer gate TG2 is not yet operated, electrons may not be dispersed and move toward the circulation gate CG2. For example, not only electrons not transmitted by the transfer gate TG1, but also newly generated electrons may move toward the circulation gate CG2 as shown in FIG. 6C.

If the rising time of each of the control signals TFv2 and Vcir3 has expired, the transfer gate TG2 and the circulation gate CG3 may operate by the transfer control signal (TFv2) and the circulation control signal (Vcir3) as shown in FIG. 6D. That is, the circulation gates CG2 and CG3 and the transfer gate TG2 may operate at the same time. In this case, since the voltage ($V_H$) of the transfer control signal (TFv2) is higher than the voltage ($V_M$) of each of the circulation control signals Vcir2 and Vcir3, electrons may move toward the transfer gate TG2 and may flow into the floating diffusion region FD2 by the transfer gate TG2.

Figure 6E:
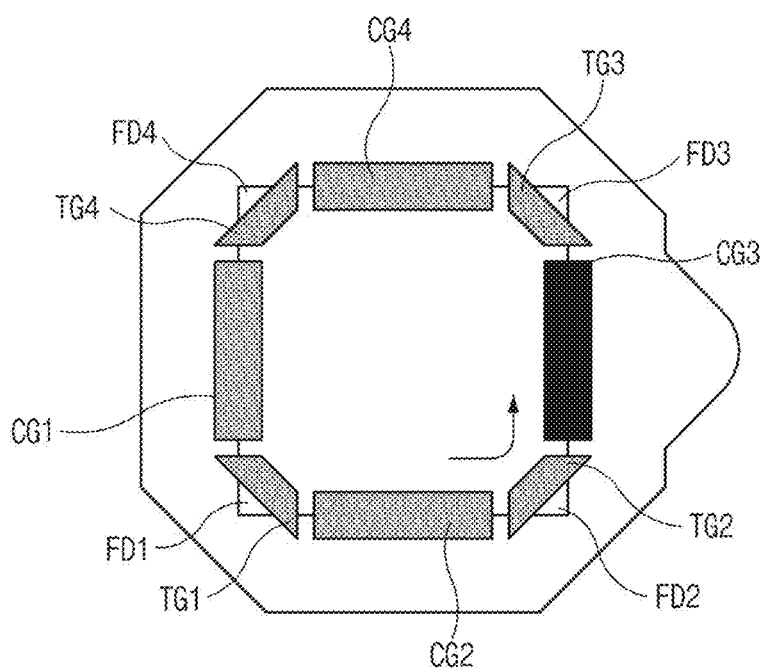
Figure 6F:
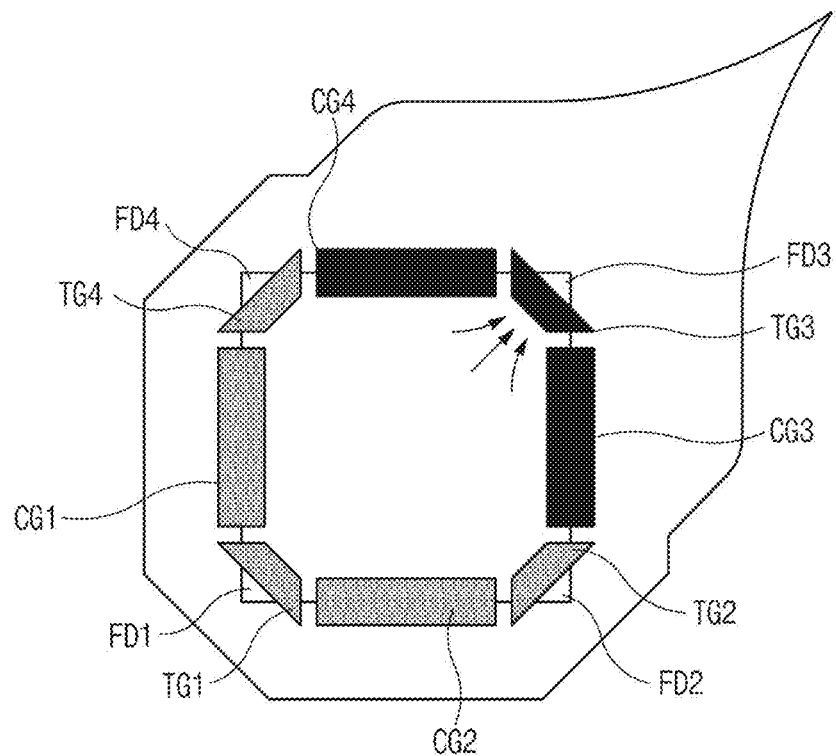

Referring to FIGS. 5, 6E and 6F, the circulation control signal (Vcir2) and the transfer control signal (TFv2) may be deactivated at the time point (t5), and the transfer control signal (TFv3) and the circulation control signal (Vcir4) may be activated at the time point (t5). That is, the transfer gate TG2 and the circulation gate CG2 that are located at one side of the circulation gate CG3 may stop operation, and the transfer gate TG3 and the circulation gate CG4 that are located at the other side of the circulation gate CG3 may start operation. In this case, the transfer control signal (TFv3) may have a higher voltage ($V_H$) than the circulation control signal (Vcir4).

In this case, the circulation control signal (Vcir3) is continuously activated until reaching the time point (t6). As a result, during a predetermined time in which the transfer gate TG3 is not yet operated, electrons may not be dispersed and move toward the circulation gate CG3, as shown in FIG. 6E.

If the rising time of each of the control signals TFv3 and Vcir4 has expired, the transfer gate TG3 and the circulation gate CG4 may operate by the control signals TFv3 and Vcir4 as shown in FIG. 6F. That is, the circulation gates CG3 and CG4 and the transfer gate TG3 may operate at the same time. In this case, since the voltage ($V_H$) of the transfer control signal (TFv3) is higher than the voltage ($V_M$) of each of the circulation control signals Vcir3 and Vcir4, electrons may move toward the transfer gate TG3 and may flow into the floating diffusion region FD3 by the transfer gate TG3.

Figure 6G:
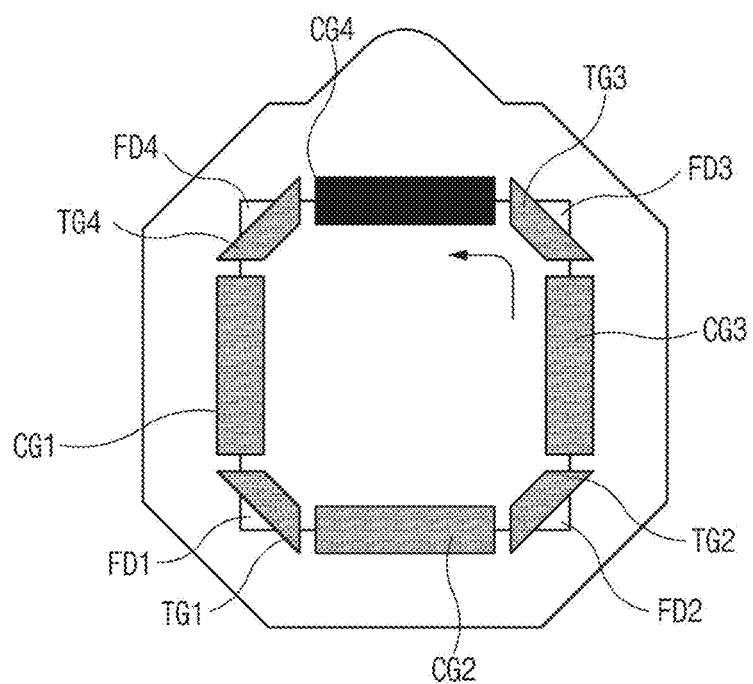
Figure 6H:
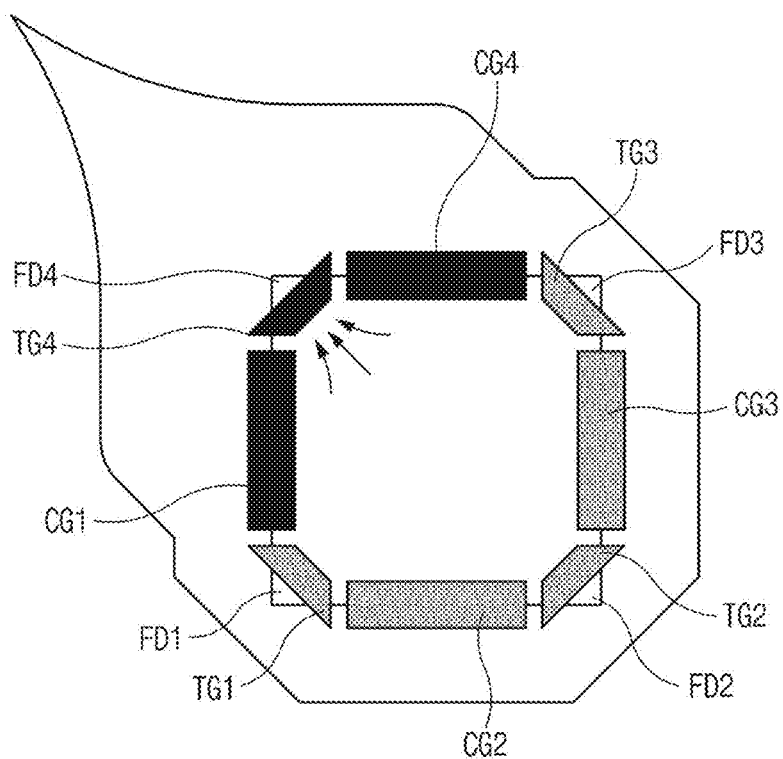

Referring to FIGS. 5, 6G and 6H, the circulation control signal (Vcir3) and the transfer control signal (TFv3) may be deactivated at the time point (t6), and the transfer control signal (TFv4) and the circulation control signal (Vcir1) may be activated at the time point (t6). In this case, the transfer control signal (TFv4) may have a higher voltage ($V_H$) than the circulation control signal Vcir1, and the circulation control signal (Vcir4) may remain activated until reaching the time point (t7).

Therefore, as shown in FIG. 6G, electrons may move toward the circulation gate CG4. Thereafter, if the rising time of each of the control signals TFv4 and Vcir1 has expired, electrons may flow into the floating diffusion region FD4 by the transfer gate TG4 as shown in FIG. 6H.

Until completion of the modulation period after the time point (t7), movement of electrons in the time period t3-t7 and sequential transmission of such electrons flowing into the floating diffusion regions FD1-FD4 may be repeatedly occurred. That is, during the modulation period, the circulation control signals applied to the circulation gates CG1-CG4 of each unit pixel (PX) and the transfer control signals applied to the transfer gates TG1-TG4 of each unit pixel (PX) can be repeatedly circulated and changed in a counterclockwise direction. If the modulation period has expired, the enable signal ($V_{EN}$) is deactivated such that the reading out period may be started. In this case, the drain voltage (Vd) may be at a high-voltage level, and the draining control signal (Vdrain) may be activated to a high-voltage ($V_H$) level. The draining control signal (Vdrain) may be applied to the circulation gates CG1-CG4 based on the switching operations of the switching elements S1-S4.

Therefore, the photoelectric conversion element (PD) may be electrically coupled to the drain nodes D1-D4 by the circulation gates CG1-CG4, such that the voltage level of the photoelectric conversion element (PD) may be fixed to the drain voltage (Vd) during the reading out period.

As is apparent from the above description, the image sensing device based on some implementations of the disclosed technology can improve operational characteristics thereof.

Although a number of illustrative embodiments have been described, it should be understood that numerous other modifications and embodiments can be devised based on what is described and/or illustrated in this patent document.

What is claimed is:

1. An image sensing device comprising:
  a pixel array including a plurality of unit pixels arranged in rows and columns,
  wherein each of the plurality of unit pixels includes:
    a photoelectric conversion element to generate charge carriers by converting light incident upon the photoelectric conversion element;
    a plurality of floating diffusion regions spaced apart from the photoelectric conversion element to hold the charge carriers;
    a plurality of circulation gates located at sides of the photoelectric conversion element in each of a first direction and a second direction perpendicular to the first direction, configured to create an electric field in different regions of the photoelectric conversion element based on circulation control signals, and configured to induce movement of the charge carriers; and
    a plurality of transfer gates located between the circulation gates, and configured to transfer the charge carriers generated by the photoelectric conversion element to a corresponding floating diffusion region.

2. The image sensing device according to claim 1, wherein the plurality of circulation gates includes:
  first circulation gates located at both sides of the photoelectric conversion element in the first direction and formed in a rectangular shape in which a length of the first circulation gates in the second direction is longer than a length of the first circulation gates in the first direction; and
  second circulation gates located at both sides of the photoelectric conversion element in the second direction and formed in a rectangular shape in which a length of the second circulation gates in the first direction is longer than a length of the second circulation gates in the second direction.

3. The image sensing device according to claim 2, wherein:
  the plurality of transfer gates is located between the first circulation gates and the second circulation gates.

4. The image sensing device according to claim 1, wherein the plurality of transfer gates and the plurality of circulation gates are located to overlap with at least partially the photoelectric conversion element.

5. The image sensing device according to claim 4, wherein:
  a longest axis of a region in which each of the plurality of circulation gates overlaps with the photoelectric conversion element is longer than a longest axis of a region in which each of the plurality of transfer gates overlaps with the photoelectric conversion element.

6. The image sensing device according to claim 1, wherein the plurality of circulation gates is configured to fix a voltage level of the photoelectric conversion element at a predetermined drain voltage based on a draining control signal.

7. The image sensing device according to claim 6, further comprising:
  a plurality of switching elements configured to selectively provide one of the circulation control signal and the draining control signal to the plurality of circulation gates.

8. The image sensing device according to claim 6, further comprising:
  a plurality of drain nodes, each located at one side of corresponding one of the plurality of circulation gates in a direction opposite to the photoelectric conversion element, and configured to receive the drain voltage.

9. The image sensing device according to claim 8, wherein the plurality of drain nodes is spaced apart from the photoelectric conversion element by a predetermined distance, and includes an impurity region formed by implantation of first-type impurities.

10. The image sensing device according to claim 1, wherein:
the plurality of circulation gates is located in regions corresponding to four sides of a rectangular shape formed to surround the photoelectric conversion element, and
the plurality of transfer gates is located in regions corresponding to vertexes of the rectangular shape.

11. The image sensing device according to claim 1, wherein the plurality of circulation gates is configured to sequentially receive the circulation control signals in a predetermined direction.

12. The image sensing device according to claim 11, wherein the transfer gates are configured and coupled to sequentially receive transfer control signals in a consecutive order.

13. The image sensing device according to claim 12, wherein:
each of the plurality of transfer gates is configured and coupled to receive the transfer control signal when the circulation gates located at both sides of each of the plurality of transfer gates receive the circulation control signals.

14. An image sensing device comprising:
a pixel array including a plurality of unit pixels for performing photoelectric conversion of incident light and outputting an electric signal corresponding to the incident light,
wherein each of the plurality of unit pixels includes:
a photoelectric conversion element to generate charge carriers by converting the incident light;
a plurality of circulation gates located at sides of the photoelectric conversion element in each of a first direction and a second direction perpendicular to the first direction;
a plurality of transfer gates located between the circulation gates while being arranged alternately with the circulation gates; and
a plurality of floating diffusion regions, each located at one side of corresponding one of the plurality of transfer gates in a direction opposite to the photoelectric conversion element based on the corresponding one of the plurality of transfer gates.

15. The image sensing device according to claim 14, further comprising:
a plurality of drain nodes, each located at one sides of the corresponding one of plurality of circulation gates in a direction opposite to the photoelectric conversion element based on the corresponding one of the plurality of circulation gates, and coupled to an input terminal of a drain voltage.

16. The image sensing device according to claim 14, further comprising:
a plurality of switching elements configured to selectively provide one of a circulation control signal and a draining control signal to the plurality of circulation gates.

17. The image sensing device according to claim 14, wherein the plurality of circulation gates and the plurality of transfer gates are disposed to overlap with at least partially the photoelectric conversion element.

18. The image sensing device according to claim 17, wherein:
a longest axis of a region in which the circulation gate overlaps with the photoelectric conversion element is longer than a longest axis of a region in which the transfer gate overlaps with the photoelectric conversion element.

19. The image sensing device according to claim 14, wherein the plurality of circulation gates includes:
first circulation gates located at both sides of the photoelectric conversion element in the first direction and formed in a manner that a length of the first circulation gates in the second direction is longer than a length of the first circulation gates in the first direction; and
second circulation gates located at both sides of the photoelectric conversion element in the second direction and formed in a manner that a length of the second circulation gates in the first direction is longer than a length of the second circulation gates in the second direction.

20. The image sensing device according to claim 14, wherein the plurality of circulation gates and the plurality of transfer gates are spaced apart from each other by a predetermined distance, and are arranged in a ring shape surrounding the photoelectric conversion element.

* * * * *